(12) United States Patent
Reynolds et al.

(10) Patent No.: US 10,956,638 B1
(45) Date of Patent: Mar. 23, 2021

(54) PROGRAMMABLE INTEGRATED CIRCUITS FOR EMULATION

(71) Applicant: XILINX, INC., San Jose, CA (US)

(72) Inventors: Bart Reynolds, Manzanita, OR (US); Xiaojian Yang, Sunnyvale, CA (US); Matthew H. Klein, Redwood City, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/514,324

(22) Filed: Jul. 17, 2019

Related U.S. Application Data

(63) Continuation of application No. 15/410,597, filed on Jan. 19, 2017, now Pat. No. 10,402,521.

(51) Int. Cl.
*G06F 30/331* (2020.01)
*G06F 30/392* (2020.01)
*G06F 30/398* (2020.01)

(52) U.S. Cl.
CPC .......... *G06F 30/331* (2020.01); *G06F 30/392* (2020.01); *G06F 30/398* (2020.01)

(58) Field of Classification Search
USPC ........................................................ 716/105
See application file for complete search history.

(56) References Cited

U.S. PATENT DOCUMENTS

| 9,038,013 | B2* | 5/2015 | Pandey | G06F 30/327 |
| | | | | 716/129 |
| 2007/0162792 | A1* | 7/2007 | Goodnow | H03K 19/17796 |
| | | | | 714/718 |
| 2010/0115191 | A1* | 5/2010 | Hampel | G06F 3/0611 |
| | | | | 711/103 |

* cited by examiner

*Primary Examiner* — Bryce M Aisaka
(74) *Attorney, Agent, or Firm* — Patterson + Sheridan, LLP

(57) ABSTRACT

Methods and apparatus are described for providing and using programmable ICs suitable for meeting the unique desires of large hardware emulation systems. One example method of classifying a programmable IC having impaired circuitry generally includes determining a partitioning of programmable logic resources into two or more groups for classifying the programmable IC, testing the programmable IC to determine at least one location of the impaired circuitry in the programmable logic resources of the programmable IC, and classifying the programmable IC based on the at least one location of the impaired circuitry in relation to the partitioning of the programmable logic resources.

20 Claims, 10 Drawing Sheets

Die #1
Completely good

702 — Die #2
Bad loc = 9,1

704

Die #3
Bad loc = 8,9

Die #4       706
Bad loc = 14,4

US 10,956,638 B1

PROGRAMMABLE INTEGRATED CIRCUITS FOR EMULATION

CROSS-REFERENCE TO RELATED APPLICATION

The present application is a continuation of U.S. patent application Ser. No. 15/410,597, entitled "PROGRAMMABLE INTEGRATED CIRCUITS FOR EMULATION" and filed Jan. 19, 2017, herein incorporated by reference in its entirety.

TECHNICAL FIELD

Examples of the present disclosure generally relate to integrated circuits (ICs) and, more particularly, to providing and using programmable ICs suitable for large hardware emulation systems.

BACKGROUND

In manufacturing and utilizing integrated circuits (ICs) such as programmable ICs, it is important that the programmable ICs operate properly in a system. Example programmable ICs include field programmable gate arrays (FPGAs), complex programmable logic devices (CPLDs), and the like, including various system-on-chip (SoC) implementations of such devices having embedded processing systems. When a completed integrated circuit malfunctions after it has been installed in a system, such as a consumer electronics product, the malfunction of the integrated circuit may cause the entire product to fail. As programmable ICs are manufactured according to smaller dimensions, defects in some of the circuits are becoming more common. Further, the increased complexity of programmable ICs, such as an increased number of layers, has also increased the possibility for electrical faults. Finally, the die size of programmable ICs has also continued to increase, and therefore, has increased the likelihood of defects.

Programmable ICs are typically tested after fabrication. In order to avoid causing problems for end users, a programmable IC is generally discarded if it contains defects that affect the active logic. The percentage of usable ICs is called the "yield," because it indicates the fraction of usable ICs in a manufactured lot. The increase in programmable IC size and density has led to an increase in the percentage of defective dice, and a corresponding decrease in product yield. A low yield has a significant economic impact on programmable IC providers. While dice having gross defects that cause the failure of an entire programmable device should be discarded, dice having localized defects that cause the failure of small portions of the programmable device circuitry may be salvaged by using only the portion of the device not having defects. One known method for using partially defective programmable devices is to sort out those devices that are defective only in an isolated function or area. The programmable device provider may sell these partially defective devices to a customer at a reduced price, rather than discarding them.

While such a use of defective programmable devices may increase the yield, there is also an associated cost of managing the defective devices. Because defects may be present in different locations for different devices, managing defective integrated circuits may be time consuming and expensive. Integrated circuits are commonly binned according to performance, such as operating speed, as well as for pass versus fail. Defective integrated circuits may be binned according to the locations of defects, for example. Consequently, each of the bins of integrated circuits having different defects are typically separately managed. Such a management obligation may be costly for a producer of programmable devices and increase the cost of selling the defective programmable devices.

SUMMARY

One example of the present disclosure is a method of classifying a programmable integrated circuit (IC) having impaired circuitry (e.g., one or more defective and/or suspect portions). The method generally includes determining a partitioning of programmable logic resources into two or more groups for classifying the programmable IC, testing the programmable IC to determine at least one location of the impaired circuitry in the programmable logic resources of the programmable IC, and classifying the programmable IC based on the at least one location of the impaired circuitry in relation to the partitioning of the programmable logic resources.

Another example of the present disclosure is a non-transitory computer-readable medium for classifying a programmable IC having impaired circuitry. The computer-readable medium generally includes instructions executable by a processing system to determine a partitioning of programmable logic resources into two or more groups for classifying the programmable IC, to test the programmable IC to determine at least one location of the impaired circuitry in the programmable logic resources of the programmable IC, and to classify the programmable IC based on the at least one location of the impaired circuitry in relation to the partitioning of the programmable logic resources.

Yet another example of the present disclosure is an apparatus for classifying a programmable IC having impaired circuitry. The apparatus generally includes a processing system and a memory coupled to the processing system. The processing system is generally programmed to determine a partitioning of programmable logic resources into two or more groups for classifying the programmable IC, test the programmable IC to determine at least one location of the impaired circuitry in the programmable logic resources of the programmable IC, and classify the programmable IC based on the at least one location of the impaired circuitry in relation to the partitioning of the programmable logic resources. The memory is typically configured to store instructions for the processing system.

Yet another example of the present disclosure is an apparatus for classifying a programmable IC having impaired circuitry. The apparatus generally includes means for determining a partitioning of programmable logic resources into two or more groups for classifying the programmable IC, means for testing the programmable IC to determine at least one location of the impaired circuitry in the programmable logic resources of the programmable IC, and means for classifying the programmable IC based on the at least one location of the impaired circuitry in relation to the partitioning of the programmable logic resources.

Yet another example of the present disclosure is a method of using a plurality of programmable integrated circuits (ICs) having programmable logic resources partitioned into two or more groups. The method generally includes mapping a portion of a logic design to each of the plurality of programmable ICs having the partitioned programmable logic resources, determining a classification of each of the plurality of programmable ICs, and compiling each of the plurality of programmable ICs to implement the respective mapped portion of the logic design, based on the classification.

Yet another example of the present disclosure is a non-transitory computer-readable medium for using a plurality of programmable ICs having programmable logic resources partitioned into two or more groups. The computer-readable medium generally includes instructions executable by a processing system to map a portion of a logic design to each of the plurality of programmable ICs having the partitioned programmable logic resources, to determine a classification of each of the plurality of programmable ICs, and to compile each of the plurality of programmable ICs to implement the respective mapped portion of the logic design, based on the classification.

Yet another example of the present disclosure is a hardware emulation system for emulating a logic design. The emulation system generally includes a first programmable IC for emulating a portion of the logic design, the first programmable IC having first programmable logic resources partitioned into two or more groups and having a first classification based on at least one first location of impaired circuitry in relation to the partitioned first programmable logic resources; and one or more other programmable ICs for emulating a remaining portion of the logic design.

Yet another example of the present disclosure is an apparatus for using a plurality of programmable ICs having programmable logic resources partitioned into two or more groups. The apparatus generally includes a processing system and a memory coupled to the processing system. The processing system is generally programmed to map a portion of a logic design to each of the plurality of programmable ICs having the partitioned programmable logic resources, to determine a classification of each of the plurality of programmable ICs, and to compile each of the plurality of programmable ICs to implement the respective mapped portion of the logic design, based on the classification. The memory is typically configured to store instructions for the processing system.

Yet another example of the present disclosure is an apparatus for using a plurality of programmable ICs having programmable logic resources partitioned into two or more groups. The apparatus generally includes means for mapping a portion of a logic design to each of the plurality of programmable ICs having the partitioned programmable logic resources, means for determining a classification of each of the plurality of programmable ICs, and means for compiling each of the plurality of programmable ICs to implement the respective mapped portion of the logic design, based on the classification.

Yet another example of the present disclosure is a method of enabling the use of a programmable device having impaired circuitry. The method generally includes determining at least one location of the impaired circuitry of the programmable device, mapping a portion of a logic design to the programmable device, and placing and routing the programmable device to implement the mapped portion of the logic design by avoiding using resources of the programmable device in the at least one location of the impaired circuitry.

Yet another example of the present disclosure is a non-transitory computer-readable medium for enabling the use of a programmable device having impaired circuitry. The computer-readable medium generally includes instructions executable by a processing system to determine at least one location of the impaired circuitry of the programmable device, to map a portion of a logic design to the programmable device, and to place and route the programmable device to implement the mapped portion of the logic design by avoiding using resources of the programmable device in the at least one location of the impaired circuitry.

Yet another example of the present disclosure is an apparatus for enabling the use of a programmable device having impaired circuitry. The apparatus generally includes a processing system and a memory coupled to the processing system. The processing system is generally programmed to determine at least one location of the impaired circuitry of the programmable device, to map a portion of a logic design to the programmable device, and to place and route the programmable device to implement the mapped portion of the logic design by avoiding using resources of the programmable device in the at least one location of the impaired circuitry. The memory is typically configured to store instructions for the processing system.

Yet another example of the present disclosure is an apparatus for enabling the use of a programmable device having impaired circuitry. The apparatus generally includes means for determining at least one location of the impaired circuitry of the programmable device, means for mapping a portion of a logic design to the programmable device, and means for placing and routing the programmable device to implement the mapped portion of the logic design by avoiding using resources of the programmable device in the at least one location of the impaired circuitry.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

DETAILED DESCRIPTION

Figure 1:
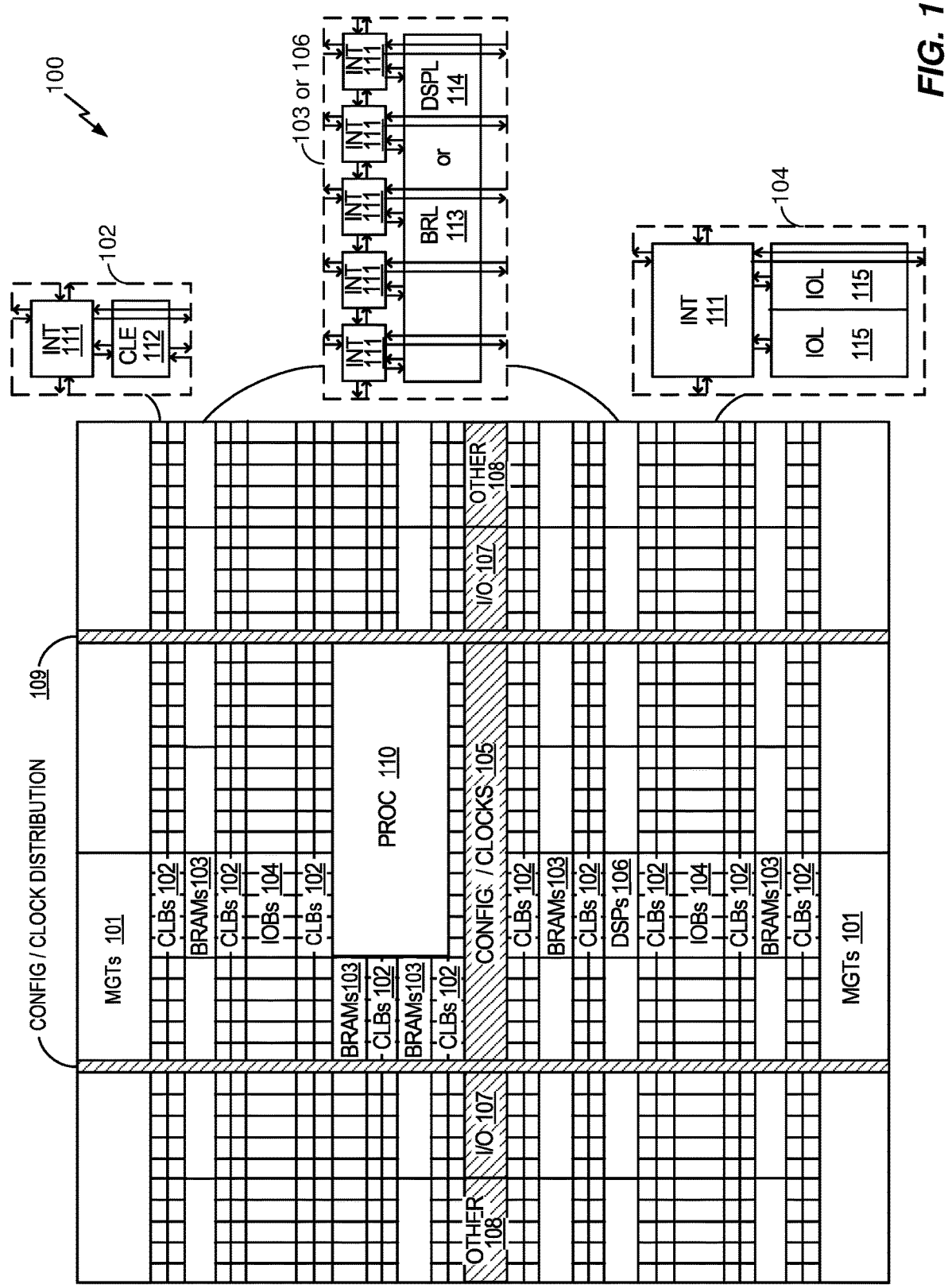
FIG. 1 is a block diagram illustrating an example architecture for a programmable device, in accordance with an example of the present disclosure.

Examples of the present disclosure provide techniques and apparatus for supplying and using programmable integrated circuits (ICs) suitable for meeting the unique desires of large hardware emulation systems (e.g., application-specific integrated circuit (ASIC) emulation systems) implemented with such ICs. Some examples provide techniques and apparatus for categorizing a programmable integrated circuit (IC) having impaired circuitry (e.g., a defective and/or suspect portion) based on a partitioning of programmable logic resources into two or more groups and for using such programmable ICs to implement a logic design. As used herein, the term "impaired circuitry" generally refers to circuitry that functions poorly or inadequately and may include defective circuitry, degraded circuitry, suspect circuitry, and the like. For some examples, the impaired circuitry may include only defective circuitry, only suspect circuitry, or both. Other examples provide techniques and apparatus for indicating and using locations of impaired circuitry in programmable ICs to implement a logic design by blocking resources from being used according to the locations of the impaired circuitry when placing and routing the ICs.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well-known features have not been described in detail so as not to obscure the description of the examples herein. For ease of illustration, the same reference numerals are used in different figures to refer to the same items; however, in alternative examples, the items may be different.

Example Programmable Device Architecture

FIG. 1 is a block diagram illustrating an example architecture 100 for a programmable device, in accordance with an example of the present disclosure. The architecture 100 may be implemented within a field programmable gate array (FPGA), for example. As shown, the architecture 100 includes several different types of programmable circuitry, e.g., logic blocks. For example, the architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing (DSP) blocks 106, specialized I/O blocks 107 (e.g., configuration ports and clock ports), and other programmable logic 108, such as digital clock managers, analog-to-digital converters (ADCs), system monitoring logic, and the like.

In some FPGAs, each programmable tile includes a programmable interconnect element (INT) 111 having standardized connections to and from a corresponding INT 111 in each adjacent tile. Therefore, the INTs 111, taken together, implement the programmable interconnect structure for the illustrated FPGA. Each INT 111 also includes the connections to and from the programmable logic element within the same tile, as shown by the examples included at the far right of FIG. 1.

For example, a CLB 102 may include a configurable logic element (CLE) 112 that can be programmed to implement user logic plus a single INT 111. A BRAM 103 may include a BRAM logic element (BRL) 113 in addition to one or more INTs 111. Typically, the number of INTs 111 included in a tile depends on the width of the tile. In the pictured example, a BRAM tile has the same width as five CLBs, but other numbers (e.g., four) can also be used. A DSP block 106 may include a DSP logic element (DSPL) 114 in addition to an appropriate number of INTs 111. An 10B 104 may include, for example, two instances of an I/O logic element (IOL) 115 in addition to one instance of an INT 111. As will be clear to a person having ordinary skill in the art, the actual I/O pads connected, for example, to the IOL 115 typically are not confined to the area of the IOL 115.

In the example architecture 100 depicted in FIG. 1, a horizontal area near the center of the die (shown shaded in FIG. 1) is used for configuration, clock, and other control logic (CONFIG/CLOCKS 105). Other vertical areas 109 extending from this central area may be used to distribute the clocks and configuration signals across the breadth of the FPGA.

Some FPGAs utilizing the architecture 100 illustrated in FIG. 1 include additional logic blocks that disrupt the regular row structure making up a large part of the FPGA. The additional logic blocks may be programmable blocks and/or dedicated circuitry. For example, a processor block depicted as PROC 110 spans several rows of CLBs 102 and BRAMs 103.

The PROC 110 may be implemented as a hard-wired processor that is fabricated as part of the die that implements the programmable circuitry of the FPGA. The PROC 110 may represent any of a variety of different processor types and/or systems ranging in complexity from an individual processor (e.g., a single core capable of executing program code) to an entire processing system having one or more cores, modules, co-processors, interfaces, or the like.

In a more complex arrangement, for example, the PROC 110 may include one or more cores (e.g., central processing units), cache memories, a memory controller, unidirectional and/or bidirectional interfaces configurable to couple directly to I/O pins (e.g., I/O pads) of the IC and/or couple to the programmable circuitry of the FPGA. The phrase "programmable circuitry" can refer to programmable circuit elements within an IC (e.g., the various programmable or configurable circuit blocks or tiles described herein) as well as the interconnect circuitry that selectively couples the various circuit blocks, tiles, and/or elements according to configuration data that is loaded into the FPGA. For example, portions shown in FIG. 1 that are external to the PROC 110 may be considered part of the, or the, programmable circuitry of the FPGA.

FIG. 1 is intended to illustrate an example architecture 100 that can be used to implement an FPGA that includes programmable circuitry (e.g., a programmable fabric) and a processing system. For example, the number of logic blocks in a row, the relative width of the rows, the number and order of rows, the types of logic blocks included in the rows, the relative sizes of the logic blocks, and the interconnect/logic implementations included at the right of FIG. 1 are purely exemplary. In an actual FPGA, for example, more than one adjacent row of CLBs 102 is typically included wherever the CLBs appear, in an effort to facilitate the efficient implementation of a user circuit design. The number of adjacent CLB rows, however, can vary with the overall size of the FPGA. Further, the size and/or positioning of the PROC 110 within the FPGA is for purposes of illustration only and is not intended as a limitation of the one or more examples of the present disclosure.

Although the architecture 100 is shown in FIG. 1 and described above as being arranged in rows, this is a matter of orientation for the programmable device. These rows would be considered as columns, horizontal would be considered as vertical, and vice versa if the image of the programmable device was rotated 90°. While FIG. 1 depicts a programmable device organized into rows for ease of illustrating on a single sheet the various blocks and the INTs 111 therein, the remainder of the present disclosure describes a columnar architecture, in which a programmable device is organized into columns. The reader will understand that the description also applies to a programmable device organized into rows, which is a matter of orientation for the device.

Example Software-Derived Dies with Partitioned Logic Resources

Application-specific integrated circuit (ASIC) and other hardware emulation customers may use hundreds of FPGAs or other programmable devices in each emulation system built. These emulation customers have unique desires for their programmable devices, compared to more typical programmable device customers. For example, emulation customers may desire: (1) atypical devices (e.g., a huge fabric capacity at a low cost); (2) an atypical fabric mix (e.g., mostly look-up tables (LUTs) and BRAMs, with maybe a few DSP blocks, and most hard blocks are useless); (3) an atypical tool outcome (e.g., guaranteed compilation (100% routability and timing closure) and both predictable and fast compile times); and (4) atypical designs (e.g., relatively slower clock speeds).

Commercially available programmable devices are generally far from ideal for ASIC emulation customers. This is mainly because commercial devices are typically optimized for general use, rather than emulation. For example, commercial devices may include an undesirable fabric resource mix and may not contain enough interconnect resources for fast, guaranteed compilation.

Conventional workarounds for emulation customers can be awkward, expensive, and/or only partly effective. For example, some emulation engineers use non-FPGA solutions or use custom-designed FPGAs for their emulation platforms. Other emulation customers may use commercial FPGAs, but may endure significant restrictions (e.g., <60%) on logic occupancy to achieve near-guaranteed compilation. Compilation times may still be too slow, and compilation may still fail too often. A placer may enforce these restrictions by imposing "target density control" to limit the density of logic used in the fabric and increase the effective availability of interconnect resources near used logic resources. Another workaround involves a vendor providing programmable devices with a resource mix tuned for emulation. While this helps address cost concerns by omitting resource types that an emulation customer is not going to use, these emulation-tuned devices do not alleviate compilation problems. Furthermore, because the emulation-tuned devices are more expensive to design and produce than more general commercial programmable devices, the cost benefit of the emulation-tuned devices for emulation is marginalized. Some vendors may simply provide special pricing discounts for commercial programmable devices to emulation customers, reducing the vendor's profit margins.

As mentioned above, however, none of these workarounds provides an adequate solution for emulation customers (and vendors). An exemplary emulation FPGA would feature a huge fabric (mostly LUTs, BRAMS, and I/Os, but no hard blocks); lots of interconnect to enable fast, guaranteed compilation; and a low price.

Conventional software-derived die (SDD) techniques may also not effectively address the desires of emulation customers. Existing SDD techniques may recover a defective die (e.g., a programmable IC die with defective areas, or at least areas with questionable performance) by blocking a relatively large region of the IC containing the impaired circuitry (e.g., one or more defective and/or suspect portions). Although such blockage addresses the cost problem effectively for emulation customers, blocking a region of the programmable IC does little or nothing to address the compilation problem.

Examples of the present disclosure provide techniques and apparatus for classifying programmable IC dies into categories based on partitioned programmable logic resources and for using such classified programmable IC dies. Examples of the present disclosure directly address the cost problem described above by blocking particular programmable logic resources (e.g., certain fabric columns), instead of a large contiguous region of the die, and preserving all interconnect resources. This has the added benefit of matching the placer's "target density control" technique for increasing compilation quality. Furthermore, the example of even/odd SDD (in which odd/even fabric columns are blocked) imposes a hard 50% logic occupancy, instead of the current soft restriction of <60%, but the even/odd SDD does this at lower cost and at dramatically better compilation reliability and speed.

Figure 2:
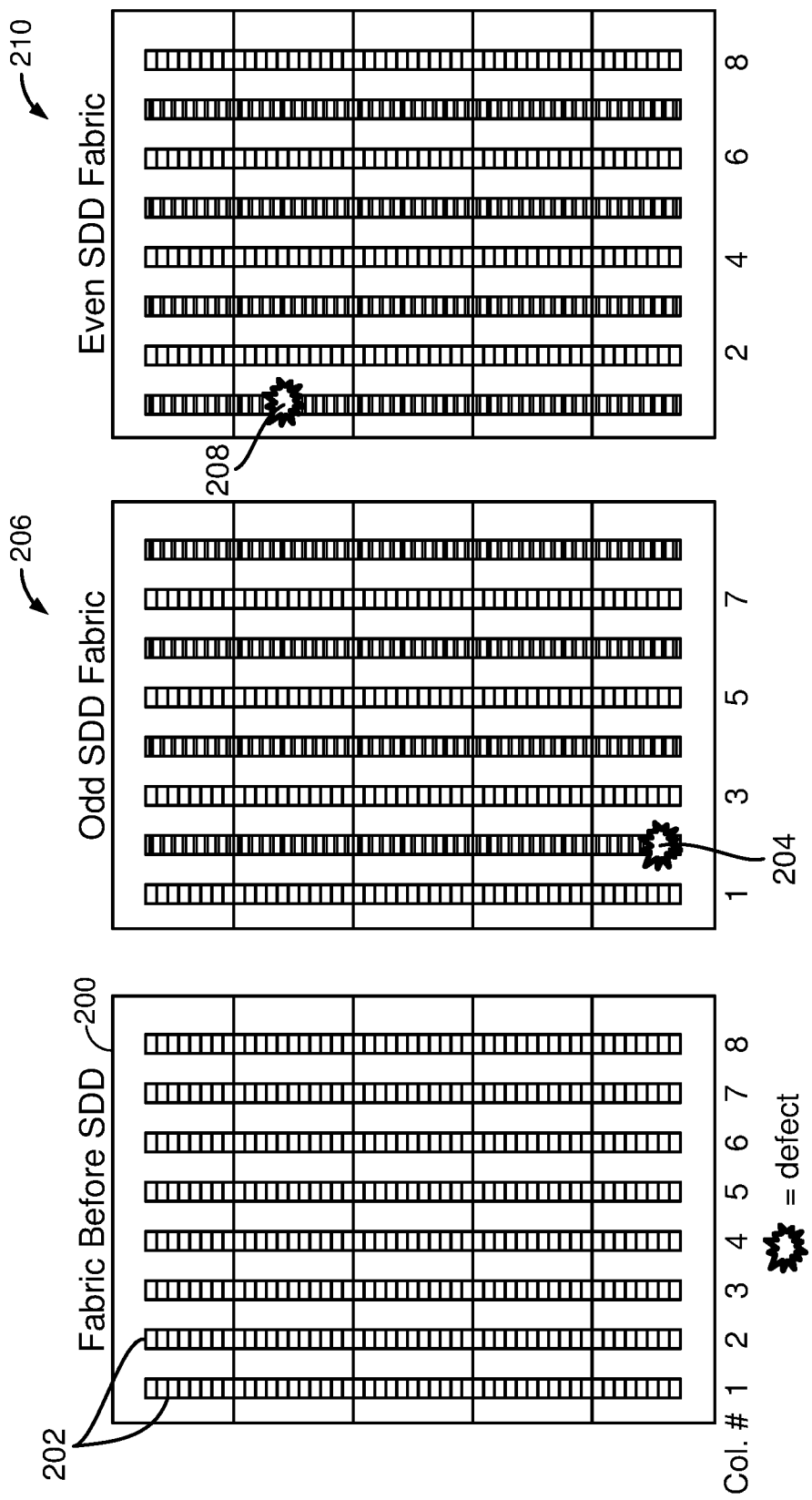
FIG. 2 illustrates different example defect locations in fabric logic resulting in different software-derived die (SDD) classifications, in accordance with an example of the present disclosure.

Even/odd SDD operates in a similar manner as conventional SDD, except that instead of blocking a large contiguous region of the device due to impaired circuitry contained therein, alternating columns of fabric logic are blocked according to the location of the impaired circuitry. FIG. 2 illustrates the fabric logic 200 before SDD testing, in which the programmable logic (e.g., CLBs 102 of FIG. 1) is arranged in columns 202. Although eight columns (numbered "1" through "8") are illustrated in FIG. 2, a person having ordinary skill in the art will understand that there may be more or less than eight columns in a programmable IC die. After testing, the fabric logic 200 of a programmable IC die having a defect 204 in an even fabric column (e.g., column #2) may be designated as having an "odd SDD fabric" 206, whereas the fabric logic 200 of a programmable IC die having a defect 208 in an odd fabric column (e.g., column #1) may be designated as having an "even SDD fabric" 210. The even columns (column #s 2, 4, 6, and 8) are blocked in the odd SDD fabric 206, whereas the odd columns (column #s 1, 3, 5, and 7) are blocked in the even SDD fabric 210, as illustrated in FIG. 2. In this manner, the location of the defect (e.g., defect 204 or 208) dictates the classification of the fabric logic 200 as odd SDD fabric 206 or even SDD fabric 210.

For some examples, a testing system may test an individual programmable IC die by testing only odd (or only even) fabric columns. If the test passes, then the programmable IC die becomes a candidate for an odd SDD (or an even SDD). After determining if the programmable IC die is a candidate, the entire IC die may be tested (including both even and odd fabric columns). If the test of the entire device fails, but the test of only odd (or only even) columns passed, then the programmable IC is classified as an odd SDD (or an even SDD). In this manner, it does not matter if an odd SDD includes only one defect or more than one defect in even columns, and vice versa.

For even/odd SDDs, a defect may occur in any logic column, or in parts of the programmable device that would not be of use to emulation customers (e.g., blocks such as DSP blocks 106, media access control (MAC) blocks, MGTs 101, Peripheral Component Interconnect Express (PCIe) blocks, etc.). This provides a large field of recovery from impaired circuitry. However, defects in interconnect or in critical subsystems such as configuration logic (CONFIG) may most likely prevent recovery for even/odd SDDs.

No hardware changes are involved in implementing even/odd SDD on any existing programmable IC family with a columnar architecture. Furthermore, because the even/odd SDD structure closely mimics the existing placer techniques for target density control, very minor vendor tool changes are expected to support even/odd SDD.

An emulation customer may build an emulation system using a mix of even and odd SDDs, for example. Functionally, the even and odd SDDs are nearly equivalent, having the same 10 s and the same logic capacity. The emulation system compiler may map a portion of the emulated design to each SDD, without regard to the even/odd status of the SDD. When each SDD is individually compiled, the compilation may determine whether that particular SDD is even or odd. Therefore, an indication of the classification of the SDD may be stored in nonvolatile memory of the programmable IC itself (e.g., in an electronically fused register), or an indication of the classification may be stored external to the programmable IC (e.g., in a database stored on a cloud computing server and accessible via "the cloud", which may be indexed via an identifier of the programmable IC). Impact on the emulation customer's software tools to support even/odd SDDs is minimal.

The even/odd SDD effectively has a "virtual architecture," with effectively twice the interconnect resources (e.g., INTs 111) of a fully functional programmable IC (i.e., one without partitioned programmable logic resources). This is unique suitable for emulation customers, who desire fast, guaranteed compilation. Any reduction in maximum operating frequency due to partitioning may most likely be acceptable, since clock speeds for emulation customers are typically very low (e.g., tens of MHz) compared to non-emulation designs (e.g., hundreds of MHz).

It is possible that even/odd SDD products may be more generally useful in the non-emulation marketplace. However, the hard 50% logic restriction and somewhat reduced operating frequencies may likely limit the broader appeal of even/odd SDD. Yet for non-emulation customers who also desire fast, guaranteed compilation, even at the expense of lower operating frequency and logic capacity, even/odd SDD may be compelling.

Even/odd SDD relies on a 2-way split of fabric resources. Other partitions of the fabric resources are feasible, such as a 3-way split (where only one third of the fabric resources are blocked or where only one third of the resources are available) or a 4-way split (where one fourth, two fourths, or three fourths of the fabric resources are blocked). Implementation-wise, there is not much difference between these different levels of partitioning: tools can handle an N-way split just as easily as a 2-way split. However, as N increases beyond 2 in cases where 1/N of the fabric resources are blocked, the benefit of extra interconnect rapidly disappears, endangering fast, guaranteed compilation, which is one of the major benefits of even/odd SDD over conventional SDD. Similarly, the cost increases as N increases beyond 2 in cases where only 1/N of the fabric resources are available.

The partitioning of programmable logic resources is not limited to columnar architectures. Any partitioning of logic resources in two (or more) groups may operate similarly. For example, in a hierarchical architecture composed of leaf regions connected by hierarchical interconnect structures, every other leaf region in the hierarchy can be blocked in a manner similar to the even/odd columnar approach.

Figure 3:
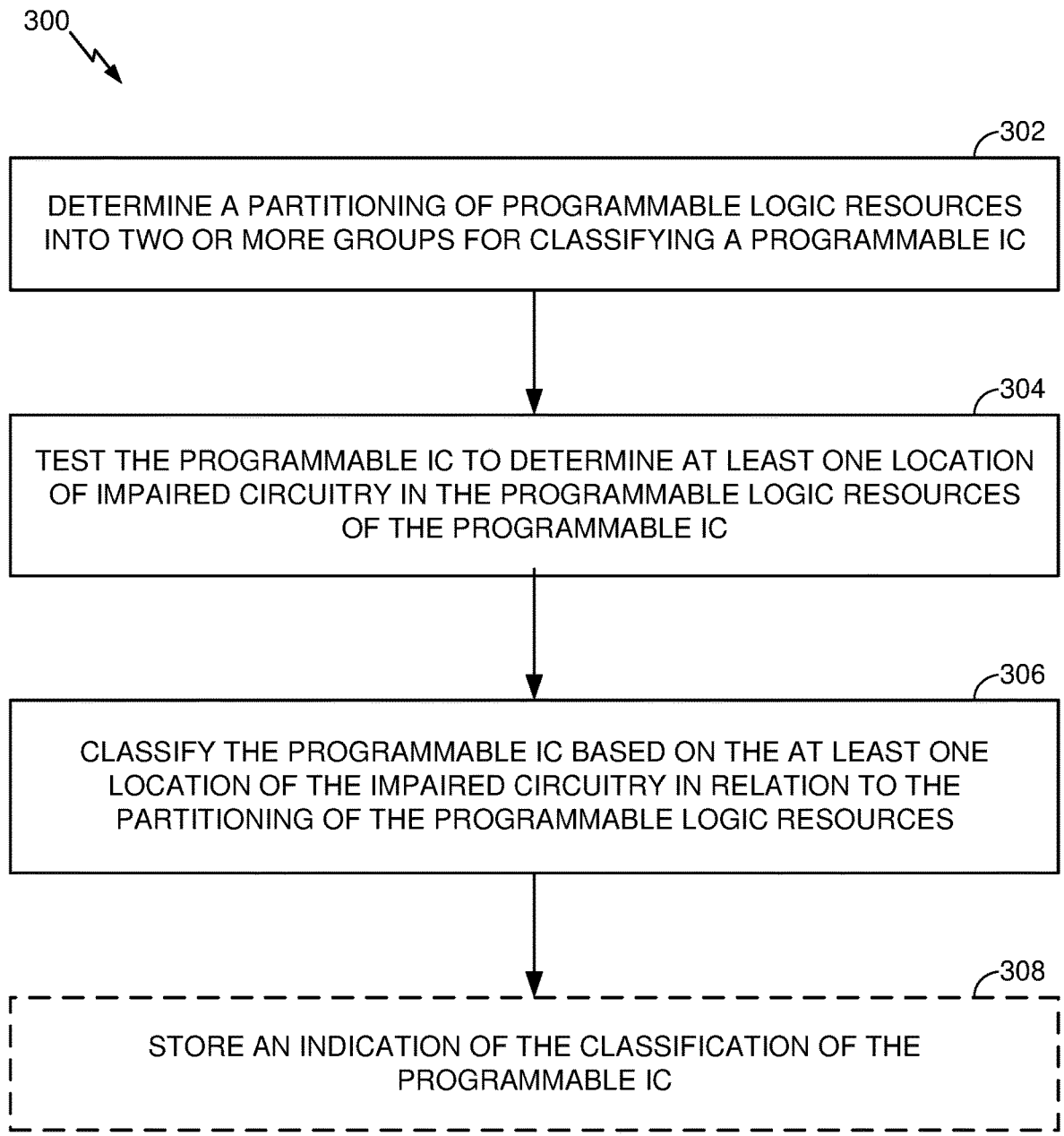
FIG. 3 is a flow diagram of example operations for classifying a programmable integrated circuit (IC), in accordance with an example of the present disclosure.

FIG. 3 is a flow diagram of example operations 300 for classifying a programmable IC having impaired circuitry, in accordance with an example of the present disclosure. The operations 300 may be performed, for example, by a testing system capable of testing a programmable IC (e.g., at the wafer level or at the package level). The programmable IC may include an FPGA, for example.

The operations 300 may begin, at block 302, with the testing system determining a partitioning of programmable logic resources into two or more groups for classifying the programmable IC. At block 304, the testing system may test the programmable IC to determine at least one location of the impaired circuitry in the programmable logic resources of the programmable IC. At block 306, the testing system may classify the programmable IC based on the at least one location of the impaired circuitry in relation to the partitioning of the programmable logic resources.

At optional block 308, the operations 300 may further involve storing an indication of the classification of the programmable IC. For some examples, this indication is stored in nonvolatile memory (e.g., an electronically fused register) of the programmable IC.

According to some examples, the operations 300 may further include marking the programmable IC according to the classification.

According to some examples, the programmable logic resources of the programmable IC are arranged in columns. For some examples, the two or more groups include even columns and odd columns of the programmable logic resources. For some examples, the at least one location of the impaired circuitry may be in an odd column of the programmable logic resources and, in this case, the classifying at block 306 may entail classifying the programmable IC as an even programmable IC. For some examples, the testing at block 304 involves testing the odd columns of the programmable logic resources; and if the programmable IC passes the testing of the odd columns, then testing all the programmable logic resources of the programmable IC. In this case, the classifying at block 306 may include classifying the programmable IC as an odd programmable IC if the programmable IC fails the testing of all the programmable logic resources, but passes the testing of the odd columns.

According to some examples, all interconnect resources of the programmable IC are preserved or otherwise available for use.

Another example of the present disclosure is an apparatus for classifying a programmable IC having impaired circuitry. The apparatus generally includes a processing system and a memory coupled to the processing system. The processing system is generally programmed to determine a partitioning of programmable logic resources into two or more groups for classifying the programmable IC, test the programmable IC to determine at least one location of the impaired circuitry in the programmable logic resources of the programmable IC, and classify the programmable IC based on the at least one location of the impaired circuitry in relation to the partitioning of the programmable logic resources. The memory is typically configured to store instructions for the processing system.

According to some examples, the processing system is further programmed to store an indication of the classification of the programmable IC in nonvolatile memory of the programmable IC.

According to some examples, the processing system is further programmed to mark the programmable IC according to the classification.

According to some examples, the programmable logic resources of the programmable IC are arranged in columns. In this case, the two or more groups may include even columns and odd columns of the programmable logic resources. For some examples, the at least one location of the impaired circuitry is in an odd column of the programmable logic resources, and the processing system is configured to classify the programmable IC as an even programmable IC. For some examples, the processing system is configured to test the programmable IC by testing the odd columns of the programmable logic resources; and if the programmable IC passes the testing of the odd columns, then testing all the programmable logic resources of the programmable IC, wherein the processing system is configured to classify the programmable IC as an odd programmable IC if the programmable IC fails the testing of all the programmable logic resources, but passes the testing of the odd columns.

Figure 4:
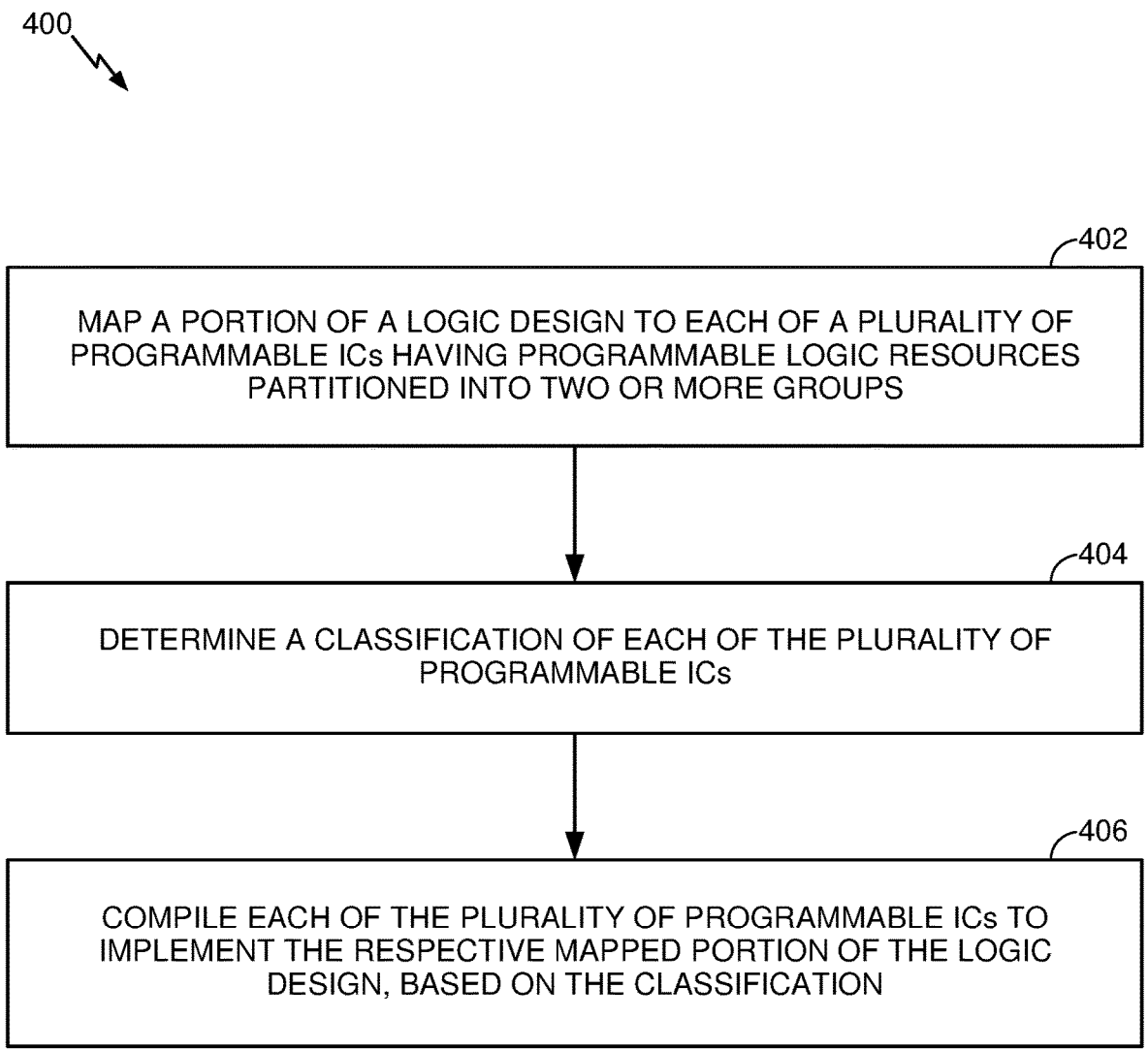
FIG. 4 is a flow diagram of example operations for using a plurality of programmable integrated circuits (ICs) having programmable logic resources partitioned into two or more groups, in accordance with an example of the present disclosure.

FIG. 4 is a flow diagram of example operations 400 for using a plurality of programmable ICs having programmable logic resources partitioned into two or more groups, in accordance with an example of the present disclosure. The operations 400 may be performed, for example, by a programming entity capable of programming a programmable IC with a configuration bitstream, such as a customer programming system. The customer programming system may be, for example, a hardware emulation system for emulating a logic design (e.g., an ASIC emulation system). The programmable ICs may include FPGAs, for example.

The operations 400 may begin, at block 402, by mapping a portion of a logic design to each of the plurality of programmable ICs having the partitioned programmable logic resources. At block 404, a classification of each of the plurality of programmable ICs may be determined. At block 406, the programming entity may compile each of the plurality of programmable ICs to implement the respective mapped portion of the logic design, based on the classification.

According to some examples, the logic design is or includes an application-specific integrated circuit (ASIC) emulation design.

According to some examples, determining the classification at block 404 involves reading an indication of the classification of each of the plurality of programmable ICs in nonvolatile memory of each programmable IC. For other examples, determining the classification at block 404 entails reading a marking on each of the plurality of programmable ICs indicative of the classification for each programmable IC. For still other examples, determining the classification at block 404 may involve receiving an indication of the classification of each of the plurality of programmable ICs from a manufacturer of the programmable ICs, for example, via a network (e.g., the Internet).

According to some examples, the programmable logic resources of each of the plurality of programmable ICs are arranged in columns. For some examples, the two or more groups include even columns and odd columns of the programmable logic resources. For some examples, one of the programmable ICs is classified as an even programmable IC. In this case, the compiling at block 406 may entail avoiding the odd columns of the programmable logic resources of the one of the programmable ICs when placing and routing the one of the programmable ICs. At least one of the odd columns of the programmable logic resources of the one of the programmable ICs may include impaired circuitry. For some examples, one of the programmable ICs is classified as an odd programmable IC. In this case, the compiling at block 406 may include avoiding the even columns of the programmable logic resources of the one of the programmable ICs when placing and routing the one of the programmable ICs. At least one of the even columns of the programmable logic resources of the one of the programmable ICs may include impaired circuitry.

According to some examples, at least some of the plurality of programmable ICs have impaired circuitry in the partitioned programmable logic resources.

According to some examples, all interconnect resources of each of the plurality of programmable IC having the partitioned programmable logic resources are preserved and available for the compiling at block 406.

Another example of the present disclosure is a hardware emulation system for emulating a logic design using a plurality of programmable ICs having programmable logic resources partitioned into two or more groups. The hardware emulation system generally includes a processing system and a memory coupled to the processing system. The processing system is generally programmed to execute instructions for mapping a portion of a logic design to each of the plurality of programmable ICs having the partitioned programmable logic resources, for determining a classification of each of the plurality of programmable ICs, and for compiling each of the plurality of programmable ICs to implement the respective mapped portion of the logic design, based on the classification. The memory is typically configured to store the instructions for the processing system.

According to some examples, the logic design is an ASIC emulation design.

According to some examples, the processing system is configured to determine the classification by reading an indication of the classification of each of the plurality of programmable ICs in nonvolatile memory of each programmable IC. For other examples, the processing system is configured to determine the classification by reading an indication of the classification of each of the plurality of programmable ICs in nonvolatile memory of each programmable IC. For other examples, the processing system is configured to determine the classification by receiving an indication of the classification of each of the plurality of programmable ICs from a manufacturer of the programmable ICs, for example, via a network (e.g., the Cloud).

According to some examples, the programmable logic resources of each of the plurality of programmable ICs are arranged in columns. In this case, the two or more groups may include even columns and odd columns of the programmable logic resources. For some examples, one of the programmable ICs is classified as an odd programmable IC, and the processing system is configured to compile the one of the programmable ICs by avoiding the even columns of the programmable logic resources of the one of the programmable ICs when placing and routing the one of the programmable ICs.

According to some examples, at least some of the plurality of programmable ICs have impaired circuitry in the partitioned programmable logic resources.

According to some examples, all interconnect resources of each of the plurality of programmable IC having the partitioned programmable logic resources are preserved and available for the compiling.

As presented herein, examples of the present disclosure address the unique desires of ASIC emulation customers, by using a tailored SDD technique in which defective dies are recovered and classified according to the location of the defect. The resulting derived dies may exclude a portion of the logic resources (e.g., even or odd fabric logic columns), as well as most hard blocks, while preserving all interconnect resources, leading to a virtual architecture with faster compilation and significant cost savings. Furthermore, supporting such techniques involves no hardware changes and may entail only minor tool changes.

Example Device-Specific Marking and Impaired Circuitry Avoidance

As described above, FPGA-based emulation may involve functionally verifying an emulation design using a system consisting of dozens or hundreds of large FPGAs. To achieve the best system performance and capacity, emulation systems typically adopt the largest FPGA of a given architecture. However, larger FPGAs are generally more expensive, which may prevent emulation customers from building larger systems at a reasonable cost.

Emulation customers typically have unique design constraints in an FPGA implementation flow. First, these customers desire 100% compilation success. To achieve this, emulation customers are willing to reduce the device utilization to provide enough room for the FPGA place-and-route tool. Second emulation designs typically have fewer and looser timing restrictions, making the timing closure a relatively easy task. Furthermore, in an emulation flow, the device under test (DUT) may be partitioned into a number of FPGA netlists, and each of these netlists may be placed, routed, and fit into one FPGA in the emulation system. Each FPGA may have its own place and route process, and there is no configuration bitstream copying from one FPGA to another.

Considering the unique design constraints of emulation customers, cost-reduction is highly valued to expand the FPGA business. Conventional SDD techniques (in which a large region of the programmable IC containing impaired circuitry is blocked) do not effectively address emulation desires, as described above. Although SDD adequately addresses the cost problem, conventional SDD makes the compilation (place-and-route) problem much harder due to significant reduction of the available device resources.

Examples of the present disclosure directly address the cost problem by leveraging the ability to recover programmable devices with minor, localized impaired circuitry without reducing the overall amount of logic and interconnect resources in the devices. Although hard shorts and open circuits may not be able to be recovered from using the techniques presented herein, the majority of failing devices may be able to be recovered. Examples of the present disclosure indicate the location of the impaired circuitry on a device-specific basis and convey this to the place-and-route tools when the programmable device is being placed and routed to block the impaired circuitry from being used.

Figure 5:
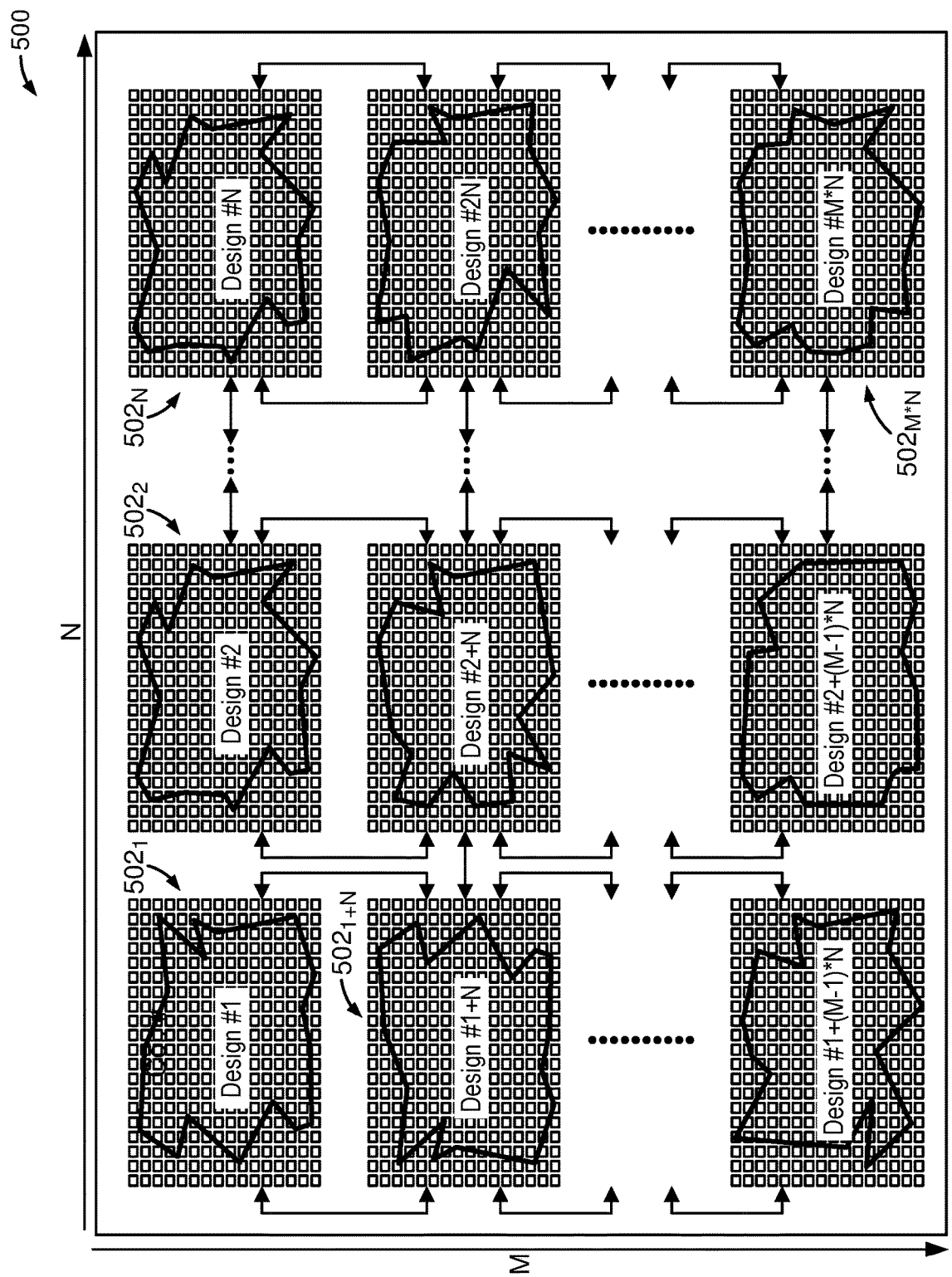
FIG. 5 illustrates an example array of M*N interconnected programmable devices used in an emulation system, in accordance with an example of the present disclosure.

FIG. 5 illustrates an example array 500 of M×N interconnected programmable devices $502_1$, $502_2$, . . . , $502_N$, $502_{1+N}$, $502_{M*N}$ (collectively "programmable devices 502") used in an emulation system, in accordance with an example of the present disclosure. The emulation system may be an ASIC emulation system, for example, which may be implemented with tens or hundreds of programmable devices 502 (e.g., FPGAs). The logic design for the emulation system may be partitioned across the array 500, and M×N unique designs may be placed and routed and then loaded into the corresponding programmable devices 502 in the emulation system. Each design per device 502 is unique and not used in other devices in other systems. This aspect allows per-device impaired circuitry (e.g., defects and suspect portions) to be worked around.

Given a programmable IC die having one or more sections that are defective or have questionable operation, the location(s) of this impaired circuitry may be indicated per die and readable by the emulation customer's tools, according to examples of the present disclosure. For some examples, the per-die indication of the location(s) of the impaired circuitry may be stored using an electronically fused register (Efuse) associated with the programmable IC die (referred to as "fusing"). In this case, the indication of the location(s) may include a combination of blown and pristine fuse links in the electronically fused register.

Figure 6:
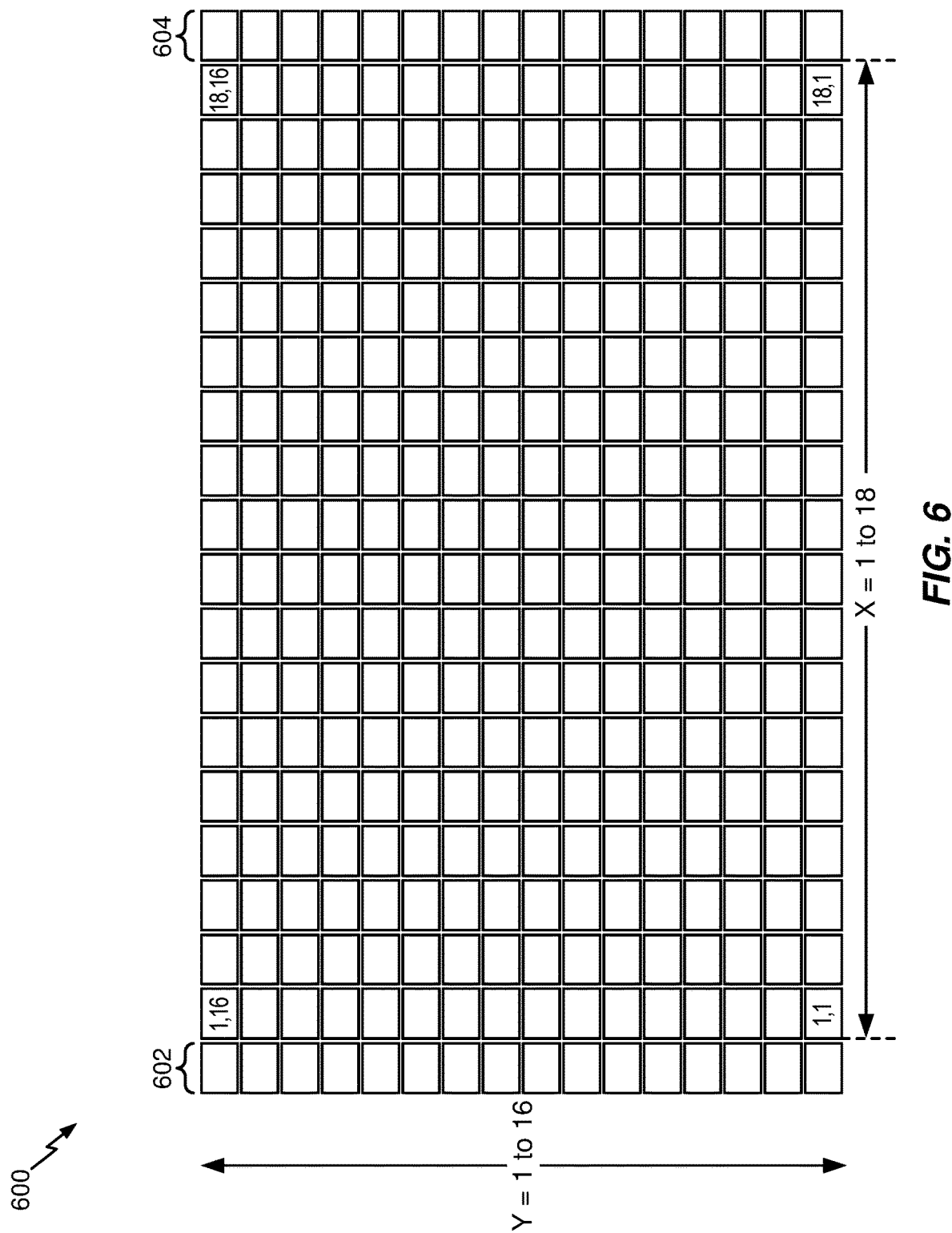
FIG. 6 illustrates an example grid defining coordinates for indicating locations of impaired circuitry in a programmable device, in accordance with an example of the present disclosure.

FIG. 6 illustrates an example grid 600 defining grid coordinates for indicating locations of impaired circuitry in a programmable device, in accordance with an example of the present disclosure. The grid 600 has space for input/output (I/O) interconnect resources in the leftmost and rightmost columns 602, 604. The remainder of the grid 600 is divided into 18 columns along the x-axis and into 16 rows along the y-axis. The corners of the remainder of the grid 600 (representing fabric resources) are designated (1,1), (1,16), (18,1), and (18,16) in a Cartesian coordinate system, as shown. The coarseness (i.e., resolution) of the grid 600 is arbitrary and is meant to balance: (1) not blocking a range that is too large an area where the impaired circuitry is contained versus (2) having a large number of bits in the Efuse to represent a very finely described range. The example grid 600 in FIG. 6 with an 18×16 coordinate system means that 1/288-sized regions would be blocked and avoided during place and route, which is approximately 0.35% of the resources. Although Cartesian coordinates are illustrated in the example grid 600 of FIG. 6, other coordinate systems (e.g., polar coordinates) may be used to indicate the locations of impaired circuitry on a per-device basis.

Figure 7A:
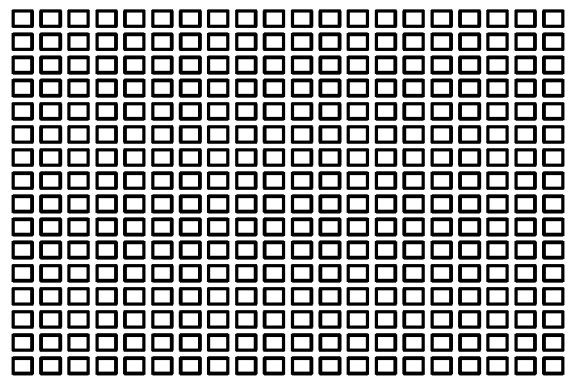
FIGS. 7A-7D illustrate example locations of impaired circuitry using the grid of FIG. 6, in accordance with examples of the present disclosure.
Figure 7B:
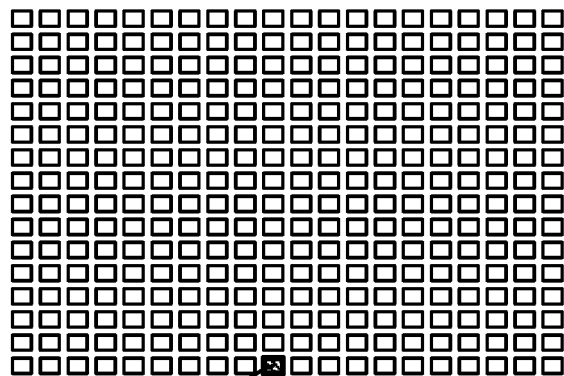
Figure 7C:
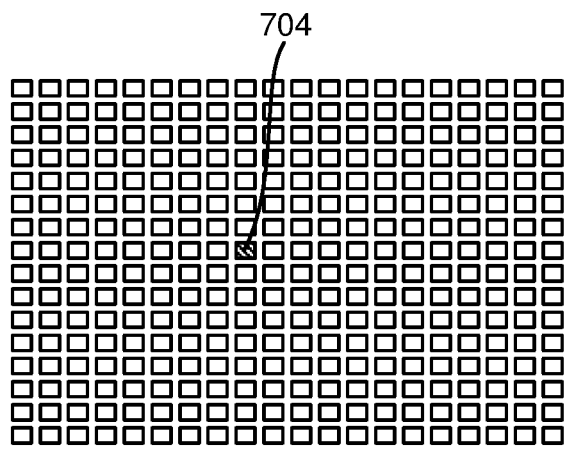
Figure 7D:
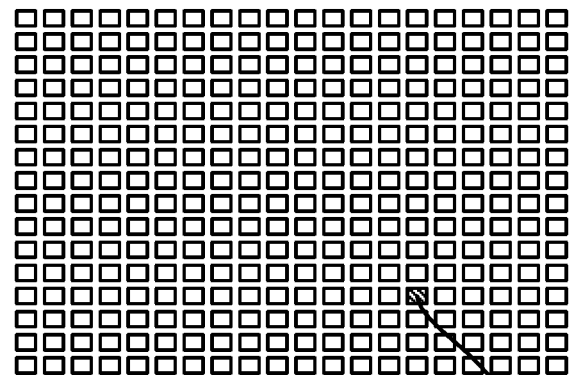

FIGS. 7A-7D illustrate example locations of impaired circuitry using the example grid 600 of FIG. 6, in accordance with examples of the present disclosure. In FIG. 7A, programmable IC die #1 has no impaired circuitry. Programmable IC die #2 in FIG. 7B has a defect 702 at (9,1), programmable IC die #3 in FIG. 7C has a defect 704 at (8,9), and programmable IC die #4 in FIG. 7D has a defect 706 at (14,4).

At device place-and-route time, the emulation customer's emulation system software may read (or may have previously read) the per-device locations of the impaired circuitry and may use prohibits to block placement of logic, interconnect, or other resources in the regions designated by these locations (e.g., by the grid coordinates).

Table 1 illustrates example locations of impaired circuitry in an example M×N array of programmable devices that may have been stored (e.g., fused) on each device uniquely during manufacturing and testing of the device. This data may be: (1) read from each unique device by the customer's software via JTAG, for example, or (2) obtained from the programmable device manufacturer or a third party and logged for each unique device.

TABLE 1

| Die # (1 to M * N) | Defect Loc. (x, y) |
|---|---|
| 1 | 6, 3 |
| 2 | 6, 10 |
| ... | ... |
| N | 13, 6 |
| 1 + N | 11, 10 |
| 2 + N | 14, 5 |
| ... | ... |
| 2N | 5, 5 |
| ... | ... |
| 1 + (M − 1) * N | 3, 14 |
| 2 + (M − 1) * N | 12, 9 |
| ... | ... |
| M * N | 17, 13 |

Figure 8:
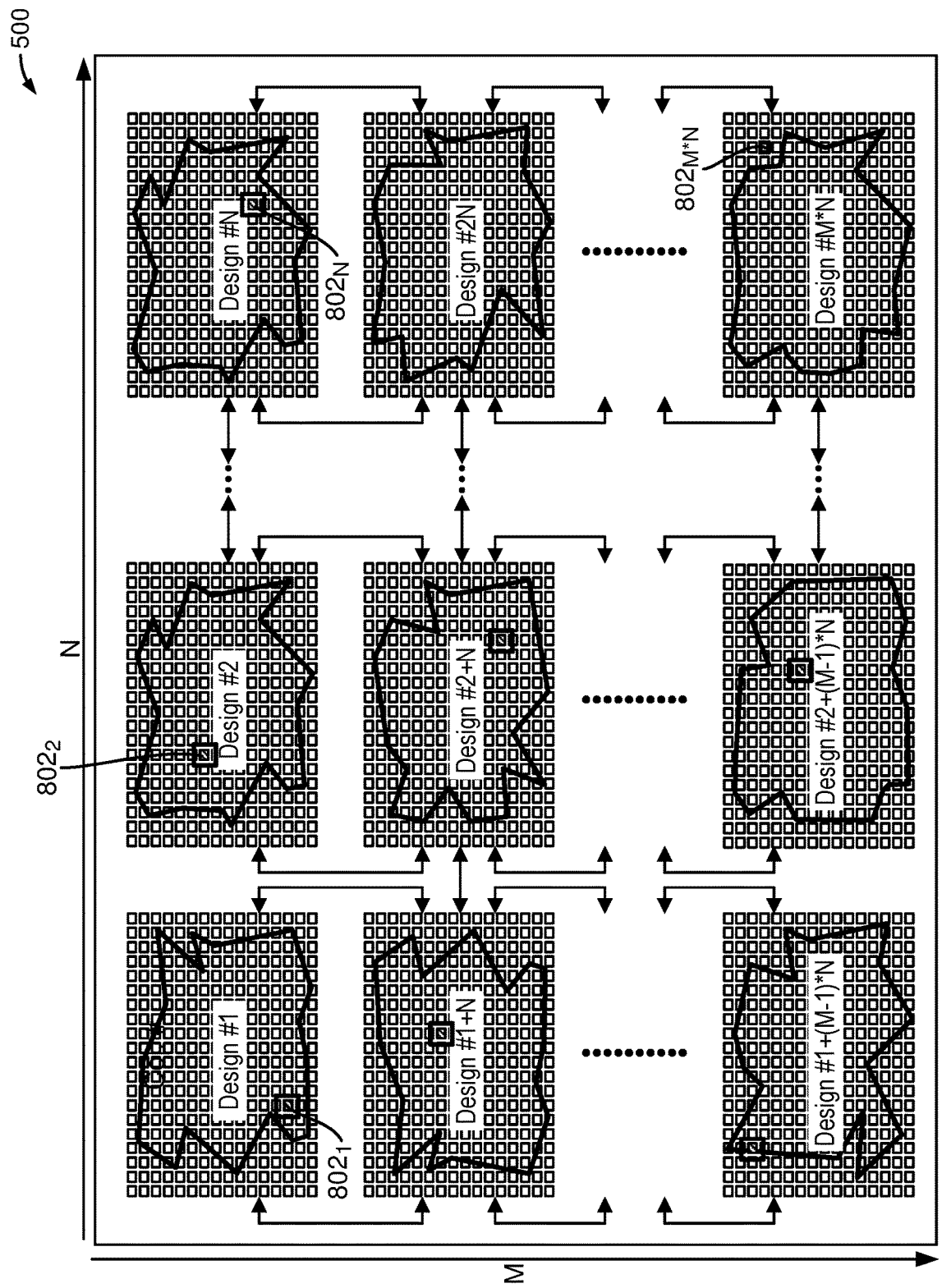
FIG. 8 illustrates an example array of M*N interconnected programmable devices and the resulting placed-and-routed designs that avoid the per-device impaired circuitry, in accordance with an example of the present disclosure.

FIG. 8 illustrates the example array 500 of M*N interconnected programmable devices 502 of FIG. 5 and the resulting placed-and-routed designs that avoid the per-device impaired circuitry $802_1$, $802_2$, ..., $802_N$, ..., $802_{M*N}$ (collectively "impaired circuitry 802") according to Table 1, in accordance with an example of the present disclosure.

Although a location of impaired circuitry is indicated for each of the programmable devices in Table 1, some programmable devices may have no impaired circuitry or more than one location of impaired circuitry. It is possible to work around multiple locations of impaired circuitry (e.g., multiple defects) in a single programmable device. Such devices may include a suitable mechanism for indicating these multiple locations, such as multiple Efuse registers or multiple locations in nonvolatile memory. The emulation customer's software may be capable of reading these multiple locations and avoiding the impaired circuitry when placing and routing the programmable device.

Figure 9:
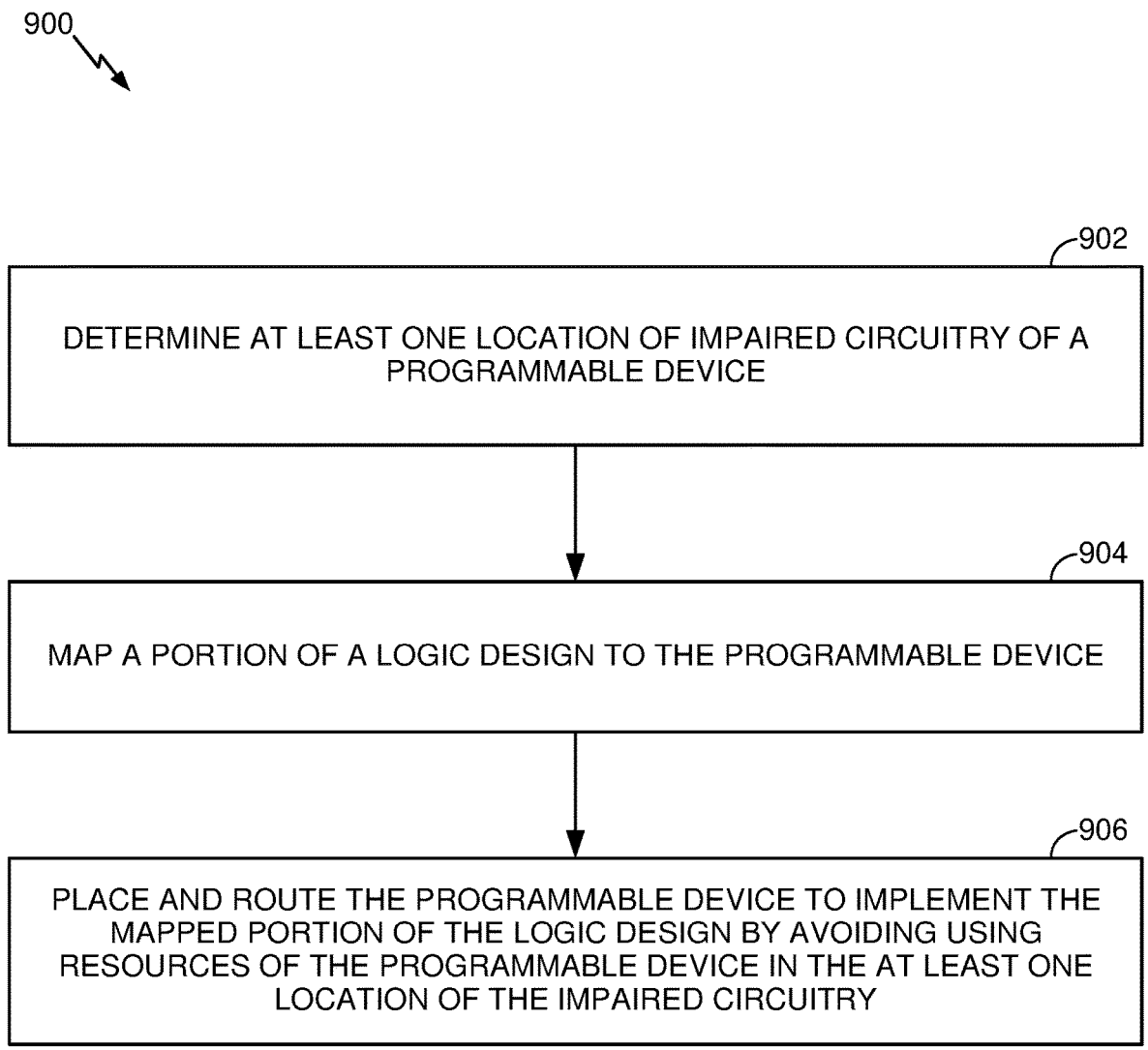
FIG. 9 is a flow diagram of example operations for enabling the use of a programmable device having impaired circuitry, from the perspective of a device programming entity, in accordance with an example of the present disclosure.

FIG. 9 is a flow diagram of example operations 900 for enabling the use of a programmable device having impaired circuitry (e.g., one or more defective and/or suspect portions), from the perspective of a device programming entity, for example. The operations 900 may be performed, for example, by a customer's programming system with a programming device, design software, and configuration software for an emulation system. For some examples, the design software and/or the configuration software may run on the programming device.

The operations 900 may begin, at block 902, with the emulation system determining at least one location of the impaired circuitry of the programmable device. At block 904, the emulation system may map a portion of a logic design to the programmable device. At block 906, the emulation system may place and route the programmable device to implement the mapped portion of the logic design by avoiding using resources of the programmable device in the at least one location of the impaired circuitry.

According to some examples, the logic design comprises an ASIC emulation design.

According to some examples, the determining at block 902 entails reading an indication of the at least one location stored in an electronically fused register (e.g., an Efuse) of the programmable device.

According to some examples, the indication of the at least one location comprises grid coordinates for the programmable device.

According to some examples, the determining at block 902 involves receiving an indication of the at least one location from a database. For some examples, the determining at block 902 further includes determining a unique identifier associated with the programmable device and accessing the database based on the unique identifier to obtain the indication of the at least one location of the impaired circuitry. In this case, determining the unique identifier may entail reading the unique identifier from nonvolatile memory of the programmable device. For some examples, the database is stored on a cloud computing server and is accessible via cloud computing.

As presented herein, examples of the present disclosure address the unique desires of ASIC emulation customers by using specially marked die, which indicate a set of array coordinates for the impaired circuitry in each particular programmable IC. Because the emulation market compiles unique per-part designs and never shares or replicates these, there is the chance to tell the place and route software which resources to avoid on a per-IC basis. This gives the programmable IC vendor the ability to ship components with impaired circuitry (e.g., localized defects) as long as the place and route software can work around the defect and/or suspect areas by using "prohibits." By utilizing this method of shipping slightly defective parts with marked defect areas coordinated with the place and route software, cost can be reduced by recovering material, which may either be passed on to the customer or taken as additional profit for the manufacturer.

Figure 10:
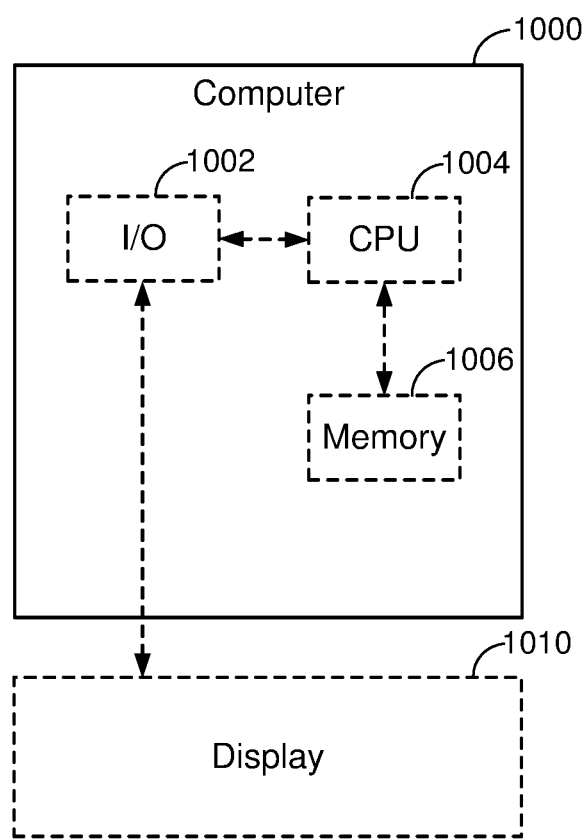
FIG. 10 is a block diagram of a general-purpose computer that may be used as a testing system or a programming system, in accordance with an example of the present disclosure.

A programmable IC testing system or a customer's programming system may be implemented with a general-purpose computer 1000, as illustrated in FIG. 10. The computer 1000 includes a central processing unit (CPU) 1004, one or more input/output (I/O) ports 1002 connected with the CPU 1004, and a memory 1006 connected with the CPU 1004. Although shown as being internal to the computer 1000, the memory 1006 may also be external to the computer 1000 or both internal and external thereto. The design software and/or the configuration software may run on the CPU 1004. For some examples, the computer 1000 may also be connected with a display 1010 (e.g., an LED display, plasma display, LCD display, cathode ray tube (CRT), and the like) via the I/O ports 1002.

Any of the operations described above, such as the operations 300, operations 400, and operations 900, may be included as instructions in a computer-readable medium for execution by a processing system, such as a testing system, a programming system, or the computer 1000. The (non-transitory) computer-readable medium may comprise any suitable memory or other storage device for storing instructions, such as read-only memory (ROM), random access memory (RAM), flash memory, an electrically erasable programmable ROM (EEPROM), a compact disc ROM (CD-ROM), a floppy disk, or a digital versatile disc ROM (DVD-ROM).

As used herein (including the claims that follow), a phrase referring to "at least one of" a list of items refers to any combination of those items, including single members. As an example, "at least one of: a, b, or c" is intended to cover: a, b, c, a-b, a-c, b-c, a-b-c, and any combination thereof (e.g., a-b-b and a-a-b-c).

While the foregoing is directed to examples of the present disclosure, other and further examples of the disclosure may be devised without departing from the basic scope thereof, and the scope thereof is determined by the claims that follow.

What is claimed is:

1. A hardware system for implementing a logic design, comprising:
a first programmable integrated circuit (IC) for implementing a portion of the logic design, the first programmable IC having first programmable logic resources partitioned into two or more groups and having a previously assigned first classification based on at least one first location of originally impaired at the time of fabrication circuitry in relation to the partitioned first programmable logic resources; and one or more other programmable ICs for implementing a remaining portion of the logic design, wherein the first programmable logic resources of the first programmable IC are arranged in columns and wherein the two or more groups comprise a first grouping of a plurality of columns and a second grouping of a plurality columns, respectively, of the first programmable logic resources.

2. The hardware system of claim 1, wherein the one or more other programmable ICs comprise a second programmable IC having second programmable logic resources partitioned into the same two or more groups and having a second classification based on at least one second location of originally impaired at the time of fabrication circuitry in relation to the partitioned second programmable logic resources.

3. The hardware system of claim 2, wherein the first programmable IC has been compiled to implement the portion of the logic design based on the first classification and wherein the second programmable IC has been compiled to implement another portion of the logic design based on the second classification.

4. The hardware system of claim 1, wherein the first and second groupings respectively comprise one of:
even columns and odd columns of the first programmable logic resources,
a first half of the columns and a second half of the columns of the first programmable logic resources,
one third of the columns and two-thirds of the columns of the first programmable logic resources,
one fourth of the columns and three-fourths of the columns of the first programmable logic resources, or
1/N of the columns and (N−1)/N of the columns of the first programmable logic resources, where N is an integer >4.

5. The hardware system of claim 4, wherein the first classification of the first programmable IC is as an odd programmable IC.

6. The hardware system of claim 4, wherein the at least one first location of the originally impaired circuitry is in an odd column of the first programmable logic resources and wherein the first classification of the first programmable IC is as an even programmable IC.

7. The hardware system of claim 4, wherein the at least one first location of the originally impaired circuitry is in an even column of the first programmable logic resources and wherein the first classification of the first programmable IC is as an odd programmable IC.

8. The hardware system of claim 1, wherein an indication of the first classification is stored in nonvolatile memory of the first programmable IC.

9. The hardware system of claim 1, wherein the first programmable logic resources are configurable to implement different hardware logic designs.

10. The hardware system of claim 1, wherein the first programmable IC comprises a field-programmable gate array.

11. The hardware system of claim 1, wherein the first programmable IC is capable of being programmed via a configuration bitstream.

12. A method for implementing a logic design on a hardware system, comprising:
implementing a portion of the logic design on a first programmable integrated circuit (IC), the first programmable IC having first programmable logic resources partitioned into two or more groups and having a previously assigned first classification based on at least one first location of originally impaired at the time of fabrication circuitry in relation to the partitioned first programmable logic resources; and
implementing a remaining portion of the logic design on one or more other programmable ICs,
wherein the first programmable logic resources of the first programmable IC are arranged in columns and wherein the two or more groups comprise a first grouping of a plurality of columns and a second grouping of a plurality columns, respectively, of the first programmable logic resources.

13. The method of claim 12, wherein the one or more other programmable ICs comprise a second programmable IC having second programmable logic resources partitioned into the same two or more groups and having a second classification based on at least one second location of originally impaired at the time of fabrication circuitry in relation to the partitioned second programmable logic resources.

14. The method of claim 13, wherein:
implementing the portion of the logic design on the first programmable IC comprises compiling the first programmable IC to implement the portion of the logic design based on the first classification; and
implementing the remaining portion of the logic design on the one or more other programmable ICs comprises compiling the second programmable IC to implement another portion of the logic design based on the second classification.

15. The method of claim 12, wherein the first and second groupings respectively comprise one of:
even columns and odd columns of the first programmable logic resources,
a first half of the columns and a second half of the columns of the first programmable logic resources,
one third of the columns and two-thirds of the columns of the first programmable logic resources,
one fourth of the columns and three-fourths of the columns of the first programmable logic resources, or
1/N of the columns and (N−1)/N of the columns of the first programmable logic resources, where N is an integer >4.

16. The method of claim 15, wherein the at least one first location of the originally impaired circuitry is in an odd column of the first programmable logic resources and wherein the first classification of the first programmable IC is as an even programmable IC.

17. The method of claim 15, wherein the at least one first location of the originally impaired circuitry is in an even column of the first programmable logic resources and wherein the first classification of the first programmable IC is as an odd programmable IC.

18. The method of claim 12, further comprising storing an indication of the first classification in nonvolatile memory of the first programmable IC.

19. The method of claim 12, wherein the first programmable logic resources are configurable to implement different hardware logic designs.

20. The method of claim 12, wherein implementing the portion of the logic design on the first programmable IC comprises programming the first programmable IC via a configuration bitstream.

* * * * *

UNITED STATES PATENT AND TRADEMARK OFFICE
CERTIFICATE OF CORRECTION

PATENT NO. : 10,956,638 B1
APPLICATION NO. : 16/514324
DATED : March 23, 2021
INVENTOR(S) : Reynolds et al.

It is certified that error appears in the above-identified patent and that said Letters Patent is hereby corrected as shown below:

In the Specification

Column 8, Line 35, Delete "hard 50%" and insert -- hard$\leq$50% --, therefor.

Column 9, Line 52, Delete "hard 50%" and insert -- hard$\leq$50% --, therefor.

Signed and Sealed this
Fourteenth Day of September, 2021

Drew Hirshfeld
*Performing the Functions and Duties of the*
*Under Secretary of Commerce for Intellectual Property and*
*Director of the United States Patent and Trademark Office*